(12) United States Patent
Franceschini et al.

(10) Patent No.: US 9,087,612 B2
(45) Date of Patent: Jul. 21, 2015

(54) DRAM ERROR DETECTION, EVALUATION, AND CORRECTION

(71) Applicant: International Business Machines Corporation, Armonk, NY (US)

(72) Inventors: Michele M. Franceschini, White Plains, NY (US); Hillery C. Hunter, Deerfield, IL (US); Ashish Jagmohan, Irvington, NY (US); Charles A. Kilmer, Essex Junction, VT (US); Kyu-hyoun Kim, Mount Kisco, NY (US); Luis A. Lastras-Montano, Cortland Manor, NY (US); Moinuddin K. Qureshi, Atlanta, GA (US)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 13/780,205

(22) Filed: Feb. 28, 2013

(65) Prior Publication Data

US 2014/0164874 A1 Jun. 12, 2014

Related U.S. Application Data

(63) Continuation of application No. 13/710,561, filed on Dec. 11, 2012, now Pat. No. 8,898,544.

(51) Int. Cl.
  *G06F 11/10* (2006.01)
  *G11C 29/42* (2006.01)
  *G11C 29/44* (2006.01)
  *G11C 29/50* (2006.01)
  *G11C 7/04* (2006.01)
  (Continued)

(52) U.S. Cl.
  CPC ............... *G11C 29/42* (2013.01); *G06F 11/10* (2013.01); *G06F 11/1048* (2013.01); *G11C 7/04* (2013.01); *G11C 7/1006* (2013.01); *G11C 29/4401* (2013.01); *G11C 29/50016* (2013.01); *G11C 2029/0409* (2013.01); *G11C 2029/0411* (2013.01); *G11C 2029/4402* (2013.01)

(58) Field of Classification Search
  CPC .................................................. G06F 11/1076
  USPC ................... 714/764, 754, 762, 763, 766, 6.2
  See application file for complete search history.

(56) References Cited

U.S. PATENT DOCUMENTS

| | | | |
|---|---|---|---|
| 4,736,344 A | | 4/1988 | Yanagisawa |
| 5,313,624 A | * | 5/1994 | Harriman et al. ............. 714/6.2 |
| 5,455,939 A | * | 10/1995 | Rankin et al. .................. 714/6.2 |

(Continued)

OTHER PUBLICATIONS

Borden et al., "On Coding for 'Stuck-at' Defects (Corresp).", IEEE Transactions on Information Theory, vol. 33, Issue 5, 1983. pp. 729-735. DOI: 10.1109/TIT.1987.1057347.

(Continued)

*Primary Examiner* — Fritz Alphonse
(74) *Attorney, Agent, or Firm* — Wood, Herron & Evans, LLP; Robert R. Williams

(57) ABSTRACT

Errors on a dynamic random access memory ("DRAM") having an error correcting decoder ("ECC") can be detected by the ECC when reading a row of the DRAM. The ECC includes error correcting code logic. If errors are detected that cannot be corrected by the ECC logic, test control logic determines weak cell information for the row, evaluates the errors using the weak cell information, and may correct the errors. The weak cell information may include weak cell locations and failure values.

4 Claims, 3 Drawing Sheets

(51) Int. Cl.
*G11C 7/10* (2006.01)
*G11C 29/04* (2006.01)

(56) References Cited

U.S. PATENT DOCUMENTS

| | | | |
|---|---|---|---|
| 5,703,823 A | 12/1997 | Douse et al. | |
| 5,740,188 A * | 4/1998 | Olarig | 714/763 |
| 6,167,551 A * | 12/2000 | Nguyen et al. | 714/770 |
| 6,215,714 B1 | 4/2001 | Takemae et al. | |
| 6,219,292 B1 | 4/2001 | Jang | |
| 6,483,764 B2 | 11/2002 | Chen Hsu et al. | |
| 6,618,314 B1 | 9/2003 | Fiscus et al. | |
| 6,728,156 B2 | 4/2004 | Kilmer et al. | |
| 6,920,523 B2 | 7/2005 | Le et al. | |
| 7,095,669 B2 | 8/2006 | Oh | |
| 7,206,244 B2 | 4/2007 | Cruz et al. | |
| 7,233,538 B1 | 6/2007 | Wu et al. | |
| 7,305,518 B2 | 12/2007 | Zeighami et al. | |
| 7,444,577 B2 | 10/2008 | Best et al. | |
| 7,461,320 B2 | 12/2008 | Klein | |
| 7,515,494 B2 | 4/2009 | Butler | |
| 7,526,713 B2 | 4/2009 | Klein | |
| 7,565,479 B2 | 7/2009 | Best et al. | |
| 7,734,866 B2 | 6/2010 | Tsern | |
| 7,742,356 B2 | 6/2010 | Dono et al. | |
| 7,818,651 B2 | 10/2010 | Nagai et al. | |
| 8,264,903 B1 | 9/2012 | Lee et al. | |
| 8,588,017 B2 | 11/2013 | Park et al. | |
| 8,621,324 B2 * | 12/2013 | Suh | 714/764 |
| 2002/0040417 A1 | 4/2002 | Winograd et al. | |
| 2007/0104004 A1 | 5/2007 | So et al. | |
| 2010/0318733 A1 | 12/2010 | Seo et al. | |
| 2012/0051169 A1 | 3/2012 | Lee | |
| 2014/0164820 A1 | 6/2014 | Franceschini et al. | |

OTHER PUBLICATIONS

Heegard et al., "On the Capacity of Computer Memory with Defects", IEEE Transactions on Information Theory, vol. 29, Issue 5, 1983. pp. 731-739. DOI: 10.1109/TIT.1983.1056723.

Heegard, "Partitioned Linear Block Codes for Computer Memory with 'Stuck-at' Defects", IEEE Transactions on Information Theory. vol. 29, No. 6, Nov. 1983. pp. 831-842. DOI: 10.1109/TIT.1983.1056763.

Idei, Y. et al, "Dual-Period Self-Refresh Scheme for Low-Power DRAM's with On-Chip PROM Mode Register", IEEE Journal of Solid-State Circuits, Feb. 1998, pp. 253-259, vol. 33, No. 2. DOI: 10.1109/4.658627.

Kim, J., & Papaefthymiou, M., "Dynamic Memory Design for Low Data-Retention Power", Proceedings of the 10th International Workshop on Integrated Circuit Design, Power and Timing Modeling, Optimization and Simulation, PATMOS '00, in Lecture Notes in Computer Science, vol. 1918/2000 Springer-Verlag, 2000, pp. 207-216.

Kim, J., & Papaefthymiou, M., "Block-Based Multi-Period Refresh for Energy Efficient Dynamic Memory", 14th Annual IEEE International ASIC/SOC Conference 2001, Sep. 12-15, 2001. IEEE Issue Aug. 7, 2002. pp. 193-197. DOI: 10.1109/ASIC.2001.954696.

Kim, J., & Papaefthymiou, M., "Block-Based Multi-Period Dynamic Memory Design for Low Data-Retention Power", IEEE Transactions on Very Large Scale Integration (VLSI) Systems, Dec. 2003, pp. 1006-1018, vol. 11, No. 6. DOI: 10.1109/TVSLI.2003.817524.

Krishnamoorthy et al., "Error Control to Increase the Yield of Semiconductor RAM's", The 1998 IEEE/CAM Information Theory Workshop at Cornell, 1989. DOI: 10.1109/ITW.1989.761432.

Lastras-Montano et al., "Algorithms for memories with stuck cells", 2010 IEEE International Symposium on Information Theory Proceedings (ISIT), Jun. 13-18, 2010, Austin, TX, pp. 968-972. DOI: 10.1109/ISIT.2010.5513786.

Ohsawa et al., "Optimizing the DRAM Refresh Count for Merged DRAM/Logic LSIs", International Proceedings on Low Power Electronics and Design, 1998. pp. 82-87.

Venkatesan et al., "Retention-Aware Placement in DRAM (RAPID): Software Methods for Quasi-Non-Volatile DRAM", The 12th International Symposium on High Performance Computer Architecture, 2006. pp. 157-167. DOI: 10.1109/HPCA.2006.1598122.

U.S. Appl. No. 12/433,157, filed Apr. 30, 2009, "Increased Capacity Heterogeneous Storage Elements", Elfadel et al.

U.S. Appl. No. 12/553,400, filed Sep. 3, 2009, "Advanced Memory Device Having Improved Performance, Reduced Power and Increased Reliability", Chiu et al.

U.S. Appl. No. 12/814,142, filed Jun. 11, 2010, "Encoding Data Into Constrained Memory", Franceschini et al.

U.S. Appl. No. 12/963,797, filed Dec. 9, 2010, "Memory System With a Programmable Refresh Cycle", Kilmer et al.

* cited by examiner

DRAM ERROR DETECTION, EVALUATION, AND CORRECTION

CROSS-REFERENCE TO RELATED APPLICATIONS

This application is a continuation of co-pending U.S. patent application Ser. No. 13/710,561, filed Dec. 11, 2012. The aforementioned related patent application is herein incorporated by reference in its entirety.

FIELD OF INVENTION

This disclosure relates to DRAM (dynamic random access memory) error correction. In particular, it relates to detecting errors on a DRAM, testing the DRAM, and evaluating the errors.

BACKGROUND

A dynamic memory cell (or "bit") stores a charge on a capacitor. The capacitor loses its charge over time and must be periodically refreshed. This refresh operation consumes resources and locks up the memory from performing other operations during the refresh, such as reading and writing. The frequency with which a particular capacitor will need refreshing depends on the construction and manufacture of the chip. On the same chip and often the same row, some capacitors may hold a charge on the order of milliseconds, while other capacitors may hold a charge on the order of seconds. If a cell fails to hold its charge or gains a charge, its written value may change, leading to memory errors.

SUMMARY

In an embodiment, this disclosure includes a method for correcting errors on a DRAM having an ECC which includes reading data from a DRAM row, detecting errors in the data that cannot be corrected by the DRAM's ECC, determining weak cell information for the row, identifying weak cells as erasures, evaluating the errors using erasure information, and correcting the errors in the data.

In another embodiment, this disclosure includes a DRAM having error detection and correction which includes a DRAM array having one or more rows of data, ECC logic capable of detecting an uncorrectable error in the DRAM, test logic for determining weak bit information for a row when the ECC logic detects an uncorrectable error, and storage for storing weak cell information.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of typical embodiments of the invention and do not limit the invention.

DETAILED DESCRIPTION

Dynamic random access memory (DRAM) must be periodically refreshed, as the capacitors that store a charge in the DRAM may leak the charge over time. However, these capacitors do not all lose or gain charge at the same rate or require refreshing at the same frequency. Due to manufacturing variations, some DRAM cells may leak or pick up charge at different rates than other cells. A leaked or picked up charge on a capacitor may cause a DRAM cell to flip, causing a memory error. Cells whose locations are known but whose values may not be known with certainty may be referred to as erasures.

Some DRAM have error correcting logic that applies error correcting codes (ECC) to correct or detect some errors. Typically, ECC provides single bit error correction and double bit error detection (SEC-DED). Under SEC-DED, if there is only one error in a DRAM row, the ECC may determine the error's location in the DRAM row and correct the error. However, if there are two errors in a DRAM row, the ECC may only detect those errors without correcting them, and the errors become uncorrectable for the ECC.

According to embodiments of the invention, DRAM may use an error correcting code that is capable of correcting a number of errors, detecting a number of errors, and correcting a number of erasures, where the number of errors detected and erasures corrected are greater than the number of errors corrected. Previously uncorrectable errors may be corrected by treating weak cells as erasures. The DRAM may determine weak cell information for a DRAM row and evaluate the errors using weak cell information to determine the location of a detected error. A DRAM utilizing this method may run with fewer uncorrectable errors. The ability of the DRAM to test weak cells once an error has been detected may allow for more precise error correction across a range of temperatures. Additionally, by increasing the allowable errors in a DRAM, the refresh rate for the DRAM may be set lower, conserving power for the DRAM.

Figure 1:
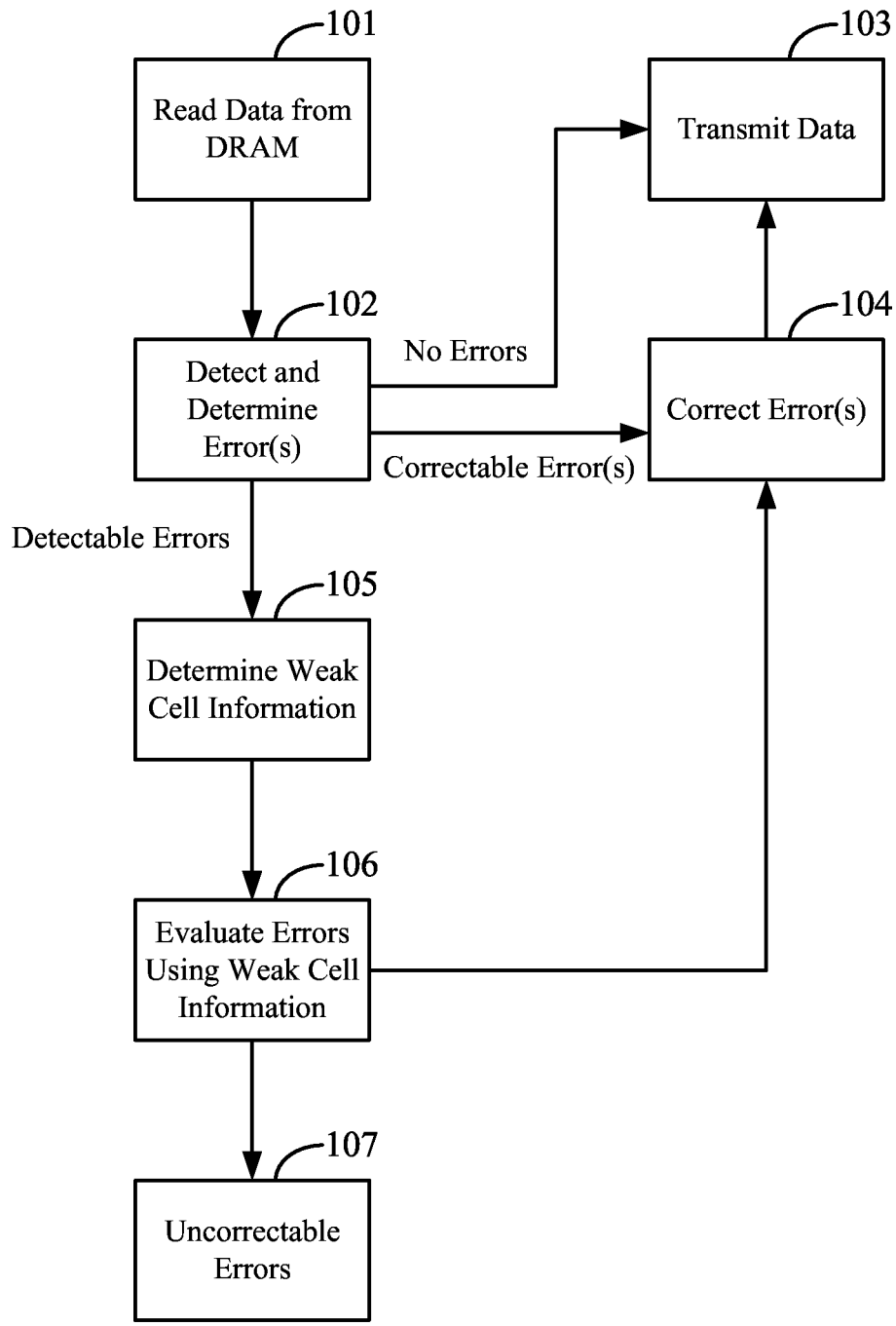
FIG. 1 is a flowchart of a method for implementing DRAM error detection and correction, according to embodiments of the invention.

FIG. 1 is a flowchart of a method for implementing DRAM error detection and correction, according to embodiments of the invention. Data may be written to a DRAM row using an ECC and the data may be read from the DRAM row, as in 101. Errors may be detected and their bit locations determined depending on the DRAM's error correction code capabilities, as in 102. If no errors are detected, the data may be transmitted, as in 103. If one or more errors are detected and their locations determined (i.e. a correctable error) in 102, the errors may be corrected as in 104, and the data transmitted as in 103. If one or more errors are detected but cannot be corrected (i.e. a detectable error) in 102, weak bit information for the DRAM row may be determined, as in 105. The detectable errors may be evaluated using the weak cell information and the weak cells treated as erasures, as in 106. The errors may be corrected, as in 104, or the errors may be uncorrectable, as in 107. If the errors are corrected, the data may be transmitted, as in 103.

Method Structure

Figure 2:
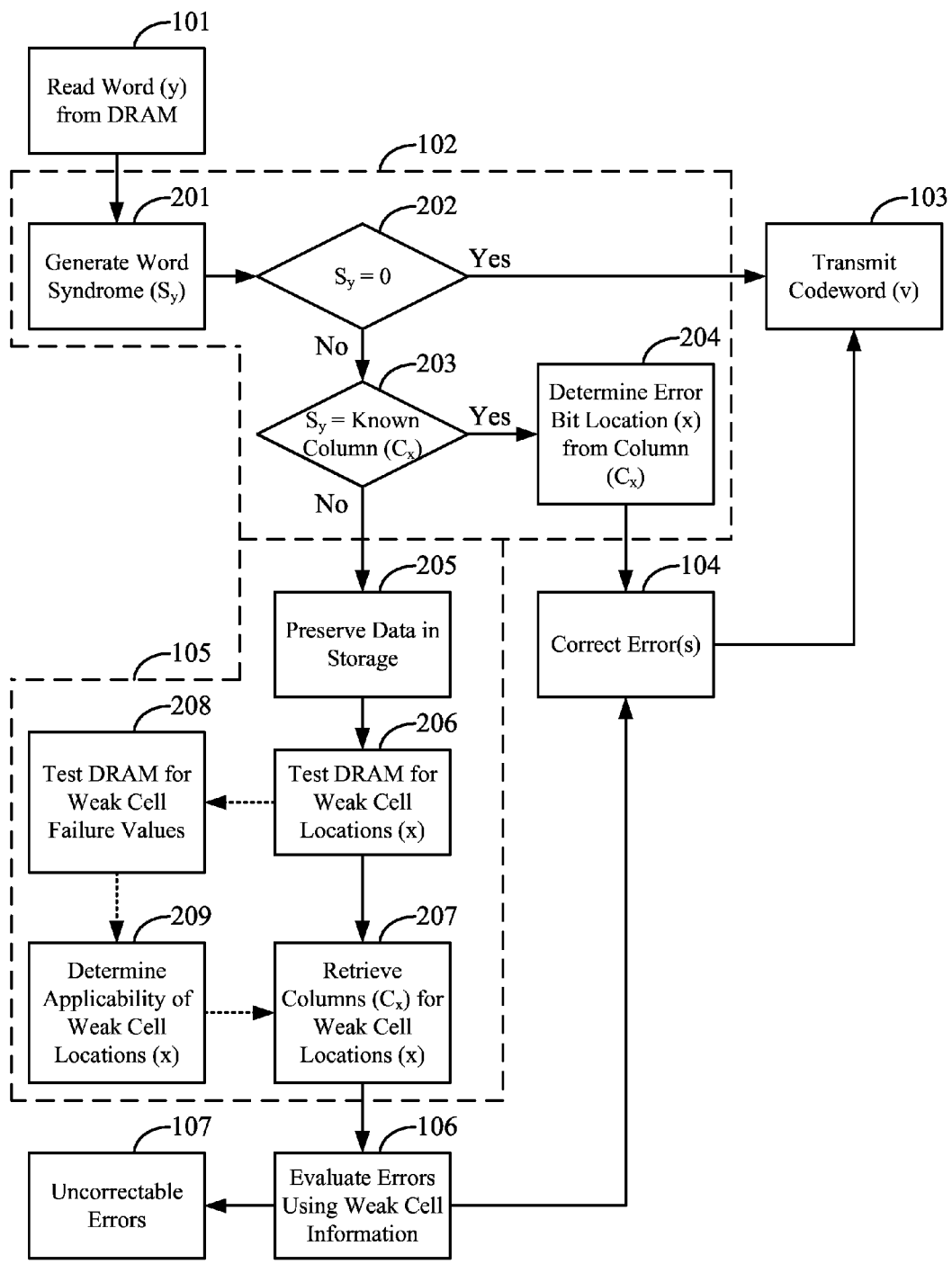
FIG. 2 is a flowchart of a method for implementing DRAM error detection and correction using binary linear block codes, according to embodiments of the invention.

FIG. 2 is a flowchart of a method for implementing DRAM error detection and correction using binary linear block codes, according to embodiments of the invention. Binary linear codes may be used in ECC (error correcting code) for encoding and decoding data used in error correction.

Determine Errors

A word (y) may be read from a DRAM row, as in 101. Errors may be detected and their locations determined depending on the DRAM's error correction code capabilities, as in 102. To detect an error, ECC logic determines whether the word (y) decoded is the same as a codeword (v) encoded. ECC logic may evaluate the word (y) to determine whether there are errors in the word (y). The ECC logic used may include, but is not limited to, single-error-correcting/double-error-detecting (SEC-DED) and double-error-correcting/triple-error-detecting (DEC-TED).

ECC logic utilizing binary linear block codes detects and corrects errors through the use of codewords (v) and a parity check matrix (H). A codeword (v) may comprise data bits (d) and parity check bits (p). The parity check matrix is a matrix whose columns, herein referred to as parity check columns ($C_x$), are generated according to Hamming distances dependent on the desired error detection and correction capabilities of the ECC. During ECC encoding, a codeword (v) is created by generating parity bits (p) so that the vector product of the parity check matrix (H) and the transpose of the codeword (v') is zero, as in the following equation:

$$H \cdot v' = 0$$

ECC logic may generate a word syndrome ($S_y$) for a word (y) read from a DRAM row, as in 201. A word syndrome ($S_y$) is a vector that may be generated by a parity check of the word (y). The following equation may represent the relationship between a vector word syndrome ($S_y$), a parity check matrix (H), and a word (y) in its transposed form (y'):

$$S_y = H \cdot y'$$

During decoding, the ECC logic may evaluate whether the data line syndrome ($S_y$) generated is equal to a zero vector, as in 202. If the data line syndrome ($S_y$) generated is a zero vector, the word (y) is the same as the codeword (v) that was encoded and written to the DRAM row, and the ECC logic may transmit the data, as in 103.

If there is an error in a word (y), the error may be represented by an error vector (E). The error vector (E) represents the difference between the codeword (v) encoded and the word (y) decoded with errors. The error vector (E) is a non-zero vector, wherein a non-zero value in the error vector (E) corresponds to the bit position (x) on the word (y) where an error has occurred, and is represented by the following equation:

$$S_y = H \cdot (v' + E') = H \cdot E'$$

The bit position (x) for the non-zero value(s) in the error vector corresponds to the parity check column(s) ($C_x$) in the parity check matrix (H), so that the word syndrome ($S_y$), as a product of the parity check matrix (H) and the transpose of the error vector (E'), is equal to the XOR summation of the parity check column(s) generated, as in the following equation:

$$S_y = H \cdot E_x = \Sigma C_x$$

where x is the bit position of an error in the error vector (E) and $C_x$ is the parity check column associated with the bit position (x).

If the word syndrome ($S_y$) generated by the parity check is not equal to a zero vector, the ECC logic may compare the word syndrome ($S_y$) generated to known parity check columns ($C_x$) of the parity check matrix (H), as in 203. If the word syndrome ($S_y$) generated by the parity check corresponds to a parity check column ($C_x$), the bit position (x) corresponding to the parity check column ($C_x$) may be determined to be the error location in the word (y), as in 204. If the word syndrome ($S_y$) generated by the parity check does not correspond to a parity check column ($C_x$), the errors may be uncorrectable by just the ECC logic and more weak cell information may be needed to correct the data.

Determine Weak Cell Information

Weak cell information for the DRAM row may be determined, as in operation 105. The weak cell information may include the locations of any weak cells, the failure values of the weak cells, and the corresponding parity check columns ($C_x$) of the weak cells. A weak cell is a cell that may not hold its expected value for a period of time, and its failure value may be the value to which the weak cell tends to fail (i.e. a "0" for a 1→0 failure). The parity check column ($C_x$) of the weak cell is the parity check column ($C_x$) that corresponds to the same bit position as the weak cell. The data from the DRAM row may be preserved in a storage location, as in 205.

The DRAM row may be tested for weak cell information, as in operation 206. The test may determine a cell's ability to hold a logical value for a refresh interval. The test may also determine a value to which the weak cell fails. The test may include writing a bit pattern to cells in the row, waiting a predetermined time, reading the values of the cells, and determining whether the value of the cells changed during the refresh time. For example, the bit pattern may be all "ones" or all "zeroes." Test logic may write a "one" to all DRAM cells in the row and read the DRAM cells after a time interval. The test logic may write a "zero" to all DRAM cells in the row and read the cells after the refresh interval. If the DRAM row is known to typically fail to a single logical value, it may be desired to only test for failure in one direction. Alternatively, the inverse of the data originally stored in the row may be written to the row and read after the time interval. These tests may determine the bit locations (x) of weak cells for that time interval and the failure values of the weak cells. The time interval may be, but is not limited to, the maximum refresh interval or a time interval greater than the maximum refresh interval, and may be adjusted if too many or few weak bits are determined during the test for error determination. The weak bit location and failure value information may be stored in a register or other storage location for later retrieval. After the bit locations (x) of the weak cells have been tested for, the parity check columns ($C_x$) for the bit locations (x) of the weak cells may be retrieved or generated, as in 207.

The applicability of the weak cells as cells that caused the errors may be further determined, as in 209. Even though a cell may be weak, it does not necessarily follow that the weak cell caused the error. The value to which a weak cell is likely to fail may be compared to the value in the word (y) corresponding to the bit location (x) of the weak cell to determine whether the weak cell may have caused the error. For example, if it is determined that a cell tends to fail to a logical value ("0") that is the inverse of the logical value ("1") for the bit in the word (y) currently stored in operation 205, it is unlikely that the weak cell caused the error, as the weak cell's value is not the value we would expect had the weak cell failed. Once the locations of the weak cells are known, the weak cells may be evaluated as erasures having a cell location but an uncertain value.

Evaluate Errors with Erasure Information

The errors may be evaluated using the weak cell information obtained from 105, as in 106. The weak cells may be evaluated by the DRAM's ECC as erasures using erasure information that includes weak cell location and failure values. The errors may be evaluated by calculating a set syndrome ($S_i$) for a set (i) of bit locations (x) identified as erasures in the error vector (E) and comparing the set syndrome ($S_i$) to the word syndrome ($S_y$). As stated above, the word syndrome ($S_y$) may be the XOR summation of the parity check columns ($C_x$) of the bit locations (x) having errors. The set syndrome equation may be:

$$S_i = H \cdot E_i' = \sum_{x \in i} C_x$$

where $S_i$ is a set syndrome, $E_i'$ is the transpose of the set error vector ($E_i$) having a set (i) of bit locations (x) having errors, and $C_x$ is the parity check column of the bit location (x) being evaluated. If the set syndrome ($S_i$) is equal to the word syndrome ($S_y$), the bit locations (x) of the set (i) are determined to be the error locations and the errors may be corrected, as in 104. If the set syndrome ($S_i$) is not equal to the word syndrome ($S_y$), the errors may be uncorrectable, as in 107. The number of bit locations (x) evaluated in a set (i) may be equal to the number of errors determined in the row. As an example, if there are two errors and bits 7 and 8 are erasures, the set syndrome ($S_{78}$) equation may be:

$$S_{78} = C_7 + C_8$$

If $S_{78}$ is equal to $S_y$, then bits 7 and 8 are the erroneous cells, and the errors may be corrected. If $S_{78}$ is not equal to $S_y$, then bits 7 and 8 are not the erroneous cells and other bit locations may be evaluated or the errors are uncorrectable, as in 107.

There may be more erasures than errors in a row, in which case different sets (i) of bit locations (x) may be evaluated to determine a single set (i) of bit locations (x) whose parity check columns ($C_x$) combine to form a set syndrome ($S_i$) that equals the data line syndrome ($S_y$). If only one set syndrome ($S_i$) is equal to the word syndrome ($S_y$), the bit locations (x) of the set (i) are determined to be the error locations. If no set syndrome ($S_i$) or more than one set syndrome ($S_i$) is equal to the word syndrome ($S_y$), the errors may be uncorrectable, as in 107. For example, if there are two errors and bits 7, 8, and 9 are erasures, the set syndrome equations may be:

$$S_{78} = C_7 + C_8;\ S_{79} = C_7 + C_9;\ S_{89} = C_8 + C_9$$

If $S_{78}$ is equal to $S_y$, and $S_{79}$ and $S_{89}$ are not equal to $S_y$, then bits 7 and 8 are the erroneous cells, and the errors may be corrected.

Once the error locations are known, the values corresponding to the error locations may be corrected, as in 105. This may involve reading the word from storage and inverting the cells at the error locations. After the errors are corrected, the correct codeword may be transmitted, as in 103.

Hardware Implementation

Figure 3:
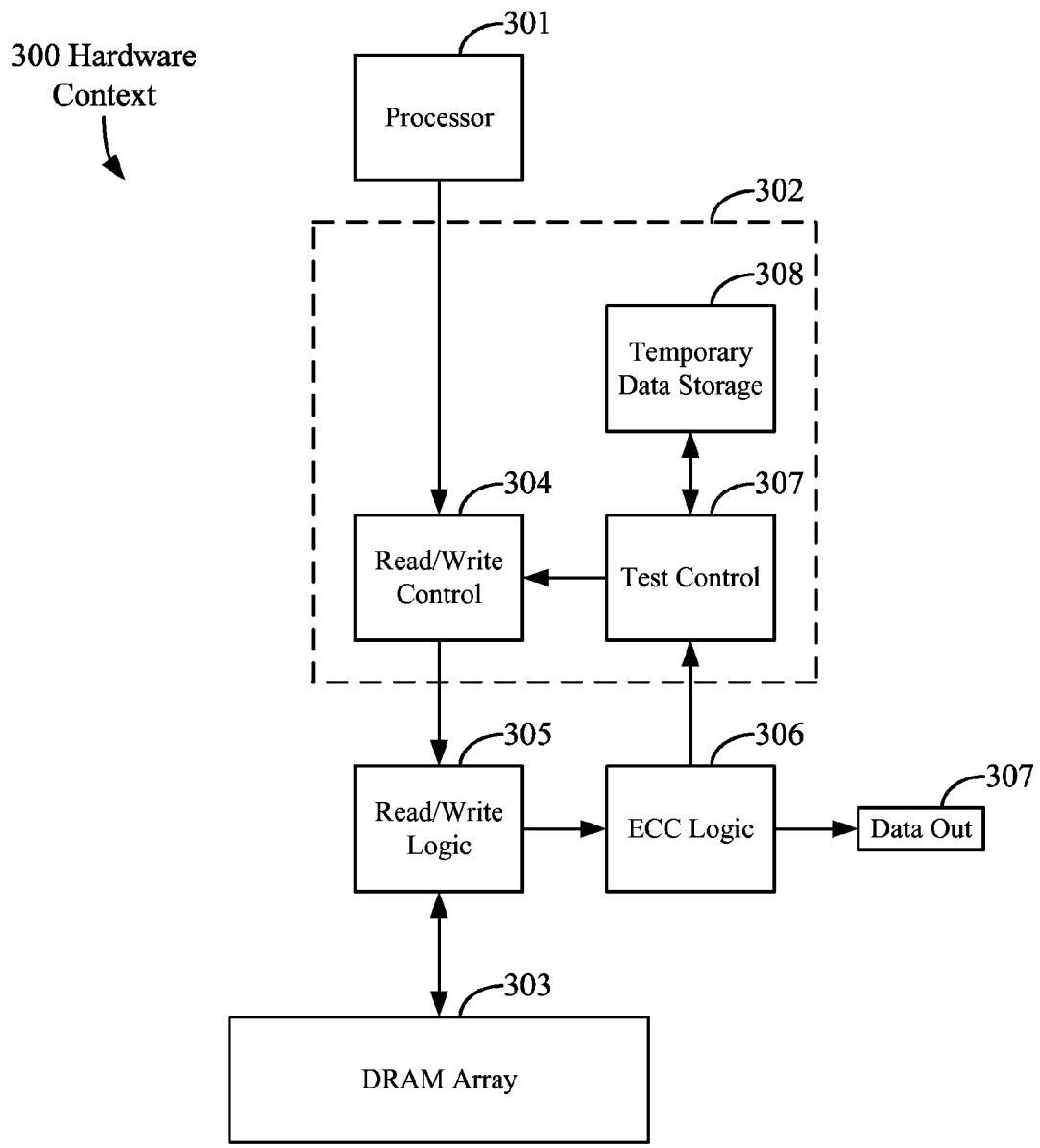
FIG. 3 is a diagrammatic representation of a computer system for implementing DRAM error detection and correction, according to embodiments of the invention.

FIG. 3 is a diagrammatic representation of a hardware context 300 for implementing error correction, according to embodiments of the invention. A processor 301 signals a memory controller 302 to read a word from a DRAM array 303. The read/write control 304 operates read/write logic 305 to read the word from a row in the DRAM array 303. The word is run through ECC logic 306 to determine if there is an error. If there are no uncorrectable errors in the word, the DRAM sends the word through data out 307. If there are uncorrectable errors in the word, the ECC logic 303 initiates test control 307 to determine the locations of weak cells in the DRAM row. Test control 307 stores the word in temporary data storage 308. The test control 307 operates the read/write logic 304 to write and read values to and from the DRAM row 303. The test control 307 detects and evaluates the test values to determine the location of any weak cells in the DRAM row. The test control 307 evaluates the errors using weak cell information and corrects and errors that are correctable.

In another embodiment, a method for performing a fast refresh may be implemented with discrete hardware or firmware components. The error correction method discussed above may be achieved through logic circuits or programmable devices, such as programmable logic arrays (PLA) or application specific integrated circuits (ASIC). The firmware may be present on-board a DRAM or off-board. The functions of the refresh rate optimization method may be performed through a combination of hardware and firmware.

Although the present invention has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the invention.

What is claimed is:

1. A dynamic random access memory ("DRAM") system having error detection and correction, comprising:
   a DRAM array having one or more rows of cells;
   an error correcting code decoder capable of detecting a first number of errors and correcting a second number of errors using an error correcting code ("ECC"), wherein the first number of errors is larger than the second number of errors and a detection of the first number of errors corresponds with a detection of an error that is uncorrectable using the ECC; and
   test control logic to determine weak cell information for a row when the error correcting code decoder detects an error that is uncorrectable using the ECC and to correct errors using the weak cell information, wherein the weak cell information includes locations and failure values of the weak cells.

2. The DRAM of claim 1, wherein the first number of errors is two and the second number of errors is one, and wherein when the error correcting code decoder detects a single error, the error correcting code decoder is capable of correcting the single error, and when the error correcting code decoder detects a two errors the test control logic is capable of correcting the two errors using the weak cell information.

3. The DRAM of claim 1, wherein the first number of errors is three and the second number of errors is two, and wherein when the error correcting code decoder detects a two errors, the error correcting code decoder is capable of correcting the two errors, and when the error correcting code decoder detects a three errors the test control logic is capable of correcting the three errors using the weak cell information.

4. The DRAM of claim 1, further comprising storage for storing the weak cell information.

* * * * *